(12) United States Patent
Kuit et al.

(10) Patent No.: US 7,440,076 B2
(45) Date of Patent: Oct. 21, 2008

(54) LITHOGRAPHIC APPARATUS, DEVICE MANUFACTURING METHOD AND DEVICE MANUFACTURED THEREBY

(75) Inventors: Jan Jaap Kuit, Veldhoven (NL); Peter Schaap, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 258 days.

(21) Appl. No.: 11/238,157

(22) Filed: Sep. 29, 2005

(65) Prior Publication Data

US 2007/0070324 A1    Mar. 29, 2007

(51) Int. Cl.
  *G03B 27/52* (2006.01)
  *G03B 27/42* (2006.01)
  *G03B 27/58* (2006.01)
  *G03B 27/32* (2006.01)
(52) U.S. Cl. .............. 355/30; 355/53; 355/72; 355/77
(58) Field of Classification Search .......... 355/30, 355/53, 72, 77
  See application file for complete search history.

(56) References Cited

U.S. PATENT DOCUMENTS

| 4,720,732 | A | 1/1988 | Tsutsui | 355/30 |
| 6,342,941 | B1 | 1/2002 | Nei et al. | 355/52 |
| 6,645,701 | B1 * | 11/2003 | Ota et al. | 430/311 |

FOREIGN PATENT DOCUMENTS

| JP | 05-129181 | 5/1993 |
| JP | 10-116772 | 5/1998 |
| JP | 10-339591 | 12/1998 |

OTHER PUBLICATIONS

European Search Report issued for European Patent Application No. 06076807.4-1226, dated Feb. 19, 2007.

* cited by examiner

*Primary Examiner*—Alan A Mathews
(74) *Attorney, Agent, or Firm*—Pillsbury Winthrop Shaw Pittman, LLP (57) ABSTRACT

A lithographic apparatus arranged to transfer a pattern from a patterning structure onto a substrate is disclosed that includes a substrate holder configured to hold a substrate and a substrate temperature conditioner configured to condition a temperature of the substrate prior to, during, or both, a transfer of the substrate to the substrate holder to substantially match a temperature of the substrate holder.

35 Claims, 3 Drawing Sheets

LITHOGRAPHIC APPARATUS, DEVICE MANUFACTURING METHOD AND DEVICE MANUFACTURED THEREBY

FIELD

The present invention relates to a lithographic apparatus, a device manufacturing method and a device manufactured thereby.

BACKGROUND

A lithography apparatus is a machine that applies a desired pattern onto a substrate, usually onto a target portion of the substrate. A lithographic apparatus can be used, for example, in the manufacture of integrated circuits (ICs). In that instance, a patterning structure, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning structure to the substrate by imprinting the pattern onto the substrate.

In the known lithography apparatus, the substrate can be held by a substrate holder during the lithographic process. The average temperature of the substrate holder can vary during use. For example, during a certain period of time, the average temperature of the substrate holder can rise, for example by heating caused by incoming exposure radiation during exposure sequences and/or due to heating caused by nearby actuators or motors. This can lead to a temperature offset between the substrate and the substrate holder, which temperature offset may result in substrate distortion and/or overlay errors.

SUMMARY

According to an aspect of the invention, there is provided a lithographic apparatus arranged to transfer a pattern from a patterning structure onto a substrate, comprising a substrate holder configured to hold a substrate; and a substrate temperature conditioner configured to condition a temperature of the substrate prior to, during, or both, a transfer of the substrate to the substrate holder to substantially match a temperature of the substrate holder.

Also, according to an aspect of the invention, there is provided a lithographic apparatus arranged to transfer a pattern from a patterning structure onto a substrate being held by a substrate support structure, the apparatus comprising a temperature control system configured to actively control the temperature of the substrate, based on a temperature of the substrate support structure, prior to, during, or both, a positioning of the substrate onto the substrate support structure.

According to an aspect of the invention, there is provided a use of the lithographic apparatus described herein.

According to an aspect of the invention, there is provided a device manufacturing method, comprising conditioning a temperature of a substrate prior to, during, or both, a transfer of the substrate to a substrate holder to substantially match a temperature of the substrate holder and transferring a pattern from a patterning structure onto the substrate after the substrate has been transferred to the substrate holder.

According to an aspect of the invention, there is provided a lithographic method, comprising actively controlling a temperature of a substrate substantially to the temperature of a substrate support structure, prior to, during, or both, a transfer of the substrate to the substrate support structure and transferring a pattern from a patterning structure onto the substrate after the substrate has been transferred to the substrate support structure.

According to an aspect of the invention, there is provided a method for handling substrates, comprising determining an instantaneous average temperature of a substrate support and conditioning a substrate to substantially the determined instantaneous average temperature of the substrate support, for example before the substrate is being transferred onto the substrate support and/or during transfer of the substrate to the substrate support.

According to an aspect of the invention, there is provided a device manufactured using the methods and/or lithographic apparatus described herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
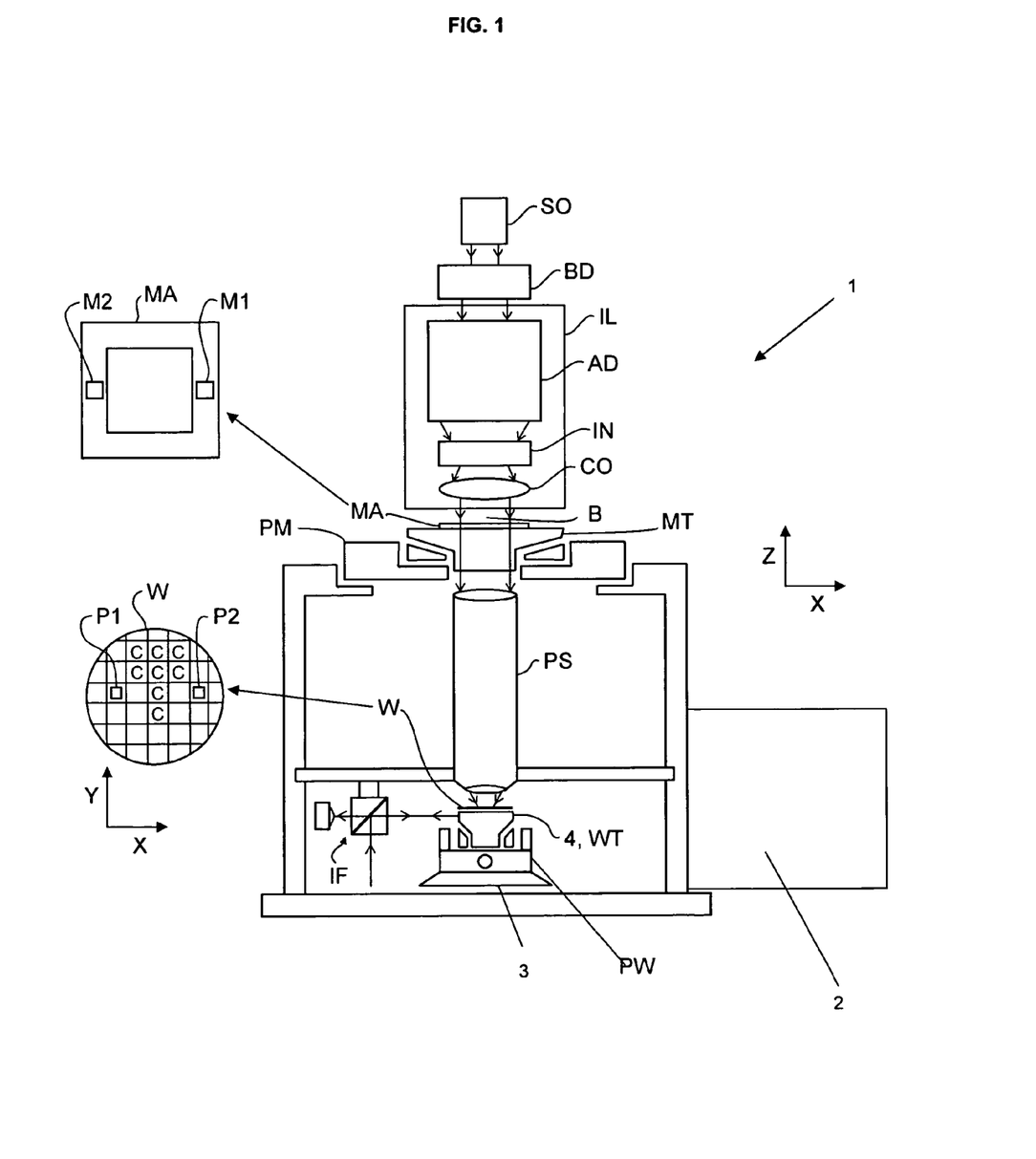
FIG. 1 depicts a lithographic apparatus according to an embodiment of the invention.

FIG. 1 schematically depicts a lithographic apparatus 1 according to an embodiment of the invention. The apparatus 1 can comprise:

an illumination system (illuminator) IL configured to condition a radiation beam B (e.g. UV radiation or another type of radiation);

a support structure (e.g. a mask table) MT constructed to support a patterning structure (e.g. a mask) MA and connected to a first positioner PM configured to accurately position the patterning structure in accordance with certain parameters;

a substrate stage 3 including a substrate holder, which substrate holder can comprise a chuck 4 with a substrate table (e.g. a wafer table) WT constructed to hold a substrate (e.g. a resist-coated wafer) W and connected to a second positioner PW configured to accurately position the substrate in accordance with certain parameters;

a projection system (e.g. a refractive projection lens system) PS configured to project a pattern imparted to the radiation beam B by patterning structure MA onto a target portion C (e.g. comprising one or more dies) of the substrate W; and a substrate handler 2 which is configured to handle substrates, for example to temporarily store one or more substrates before the substrate is transferred to the substrate table. Such a handler can also be arranged, for example, for pre-alignment. For example, the substrate table or part of the substrate table can be movable toward and from the substrate handler 2 for the substrate exchange. The substrate handler 2 can be a separate or modular component with respect to other parts of the apparatus. For example, the substrate handler 2 can be provided with or communicate with one or more load-locks (not shown). Also, the apparatus can be provided with one or more such substrate handlers.

The illumination system may include various types of optical components, such as refractive, reflective, magnetic, electromagnetic, electrostatic or other types of optical components, or any combination thereof, for directing, shaping, or controlling radiation.

The support structure holds the patterning structure in a manner that depends on the orientation of the patterning structure, the design of the lithographic apparatus, and other conditions, such as for example whether or not the patterning structure is held in a vacuum environment. The support structure can use mechanical, vacuum, electrostatic or other clamping techniques to hold the patterning structure. The support structure may be a frame or a table, for example, which may be fixed or movable as required. The support structure may ensure that the patterning structure is at a desired position, for example with respect to the projection system. Any use of the terms "reticle" or "mask" herein may be considered synonymous with the more general term "patterning structure."

The term "patterning structure" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning structure may be transmissive or reflective. Examples of patterning structures include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may be of a type wherein at least a portion of the substrate may be covered by a liquid having a relatively high refractive index, e.g. water or another suitable liquid, so as to fill a space between the projection system and the substrate. An immersion liquid may also be applied to other spaces in the lithographic apparatus, for example, between the patterning structure and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning structure (e.g., mask) MA, which is held on the support structure (e.g., mask table) MT, and is patterned by the patterning structure. Having traversed the patterning structure MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning structure MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning structure MA and substrate W may be aligned using patterning structure alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning structure MA, the patterning structure alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning structure, and the substrate table WT is moved or scanned while a pattern imparted to the radiation beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations and/or variations on the above described modes of use or entirely different modes of use may also be employed.

Figure 2:
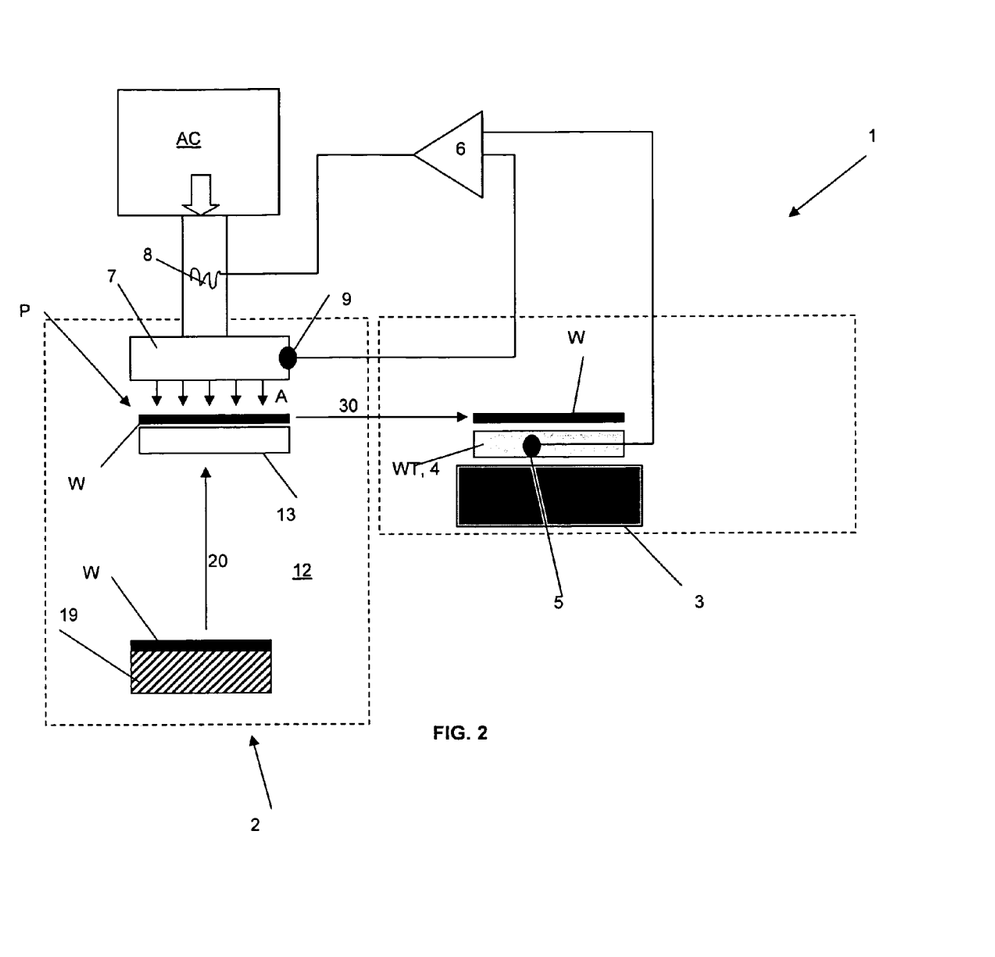
FIG. 2 depicts a first embodiment of the invention.

FIG. 2 depicts an embodiment of a lithographic apparatus 1. In FIG. 2, only part of the apparatus is depicted. The embodiment of FIG. 2 can include all or a number of the above-mentioned features of a lithographic apparatus 1 and/or of the embodiment shown in FIG. 1. The lithographic apparatus can also be constructed differently.

The apparatus 1 shown in FIG. 2 is provided with a substrate handler 2 and a substrate stage 3. The substrate stage 3 includes a substrate holder, the substrate holder comprising, for example, a chuck 4 which holds a substrate table WT. The substrate holder 4, WT can also be configured differently. In FIG. 2, the chuck 4 and support table WT are schematically shown as being one part (the substrate holder), however, generally, they may be separate parts. As is shown in FIG. 2, a substrate W can be held by the substrate table WT, for example a substrate W which is to be illuminated by a projection beam, such that a pattern from a patterning structure can be transferred to the substrate during use. Such a projection beam and patterning structure are not shown in FIG. 2, but they can be configured, for example, as described above regarding FIG. 1, as will be clear to the person skilled in the art.

The substrate stage and/or substrate holder may be configured in various ways. For example, a support side of the substrate table WT, which support side faces the substrate W during use, may comprise support protrusions or burls. Such protrusions can contact a surface of the substrate W mechanically during use. Additionally or alternatively, the substrate table WT and/or chuck 4 might include a cooling system, such as a cooling water system and/or water cooled heat shield which is configured to supply cooling water to and/or through the substrate table WT and/or chuck 4. For example, the substrate table WT may include narrow channels, which can be fed by cooling water during use to cool the substrate table WT. Also or alternatively, for example, the chuck 4 may include a water cooled heat shield. Such a cooling water system is not depicted in the figures.

The substrate stage may be provided with various positioners to position the substrate with respect to a projection system (such a system is not shown in FIG. 2, but an example of a projection system is visible in FIG. 1).

The substrate handler 2 may also be configured in various ways. For example, the substrate handler 2 may be configured to hold or store one or more substrates during a desired period of time.

The substrate handler 2 may be configured to receive one or more substrates from an environment of the apparatus 1, to temporarily store the one or more substrates, and to transfer the one or more substrates to and/or from the substrate table WT.

The substrate handler 2 may include, or be coupled to, one or more load locks (not shown), for example when the lithographic apparatus 1 includes one or more vacuum compartments. The substrate handler 2 may be configured to operate at or near atmospheric pressure, at vacuum pressures and/or at different pressures. The substrate handler 2 may include one or more aligners (not shown) to align a substrate, for example onto the substrate holder 4, WT. Also, the substrate handler 2 may include one or more substrate loading positions to load one or more substrates W which are to be transferred to the substrate stage 3. One loading position P is depicted in FIG. 2. Also, the substrate handler 2 may include one ore more substrate unloading positions to remove one or more substrates W from a substrate holder 4, WT. Additionally, the substrate handler 2 may include one or more substrate 'buffer' positions to temporarily store substrates W before being transferred to the substrate stage 3, and/or after having been illuminated by the apparatus 1.

Further, the apparatus 1 may include a mechanism (schematically depicted by arrow 30) which is arranged or configured to transfer one or more substrates W from part of the substrate handler 2 to a substrate holder 4, WT and/or vice versa. The substrate handler 2 and substrate stage 3 may be arranged or configured in various ways to transfer substrates therebetween. For example, one or more passageways (not specifically depicted) can be provided between the substrate handler 2 and substrate stage 3, to convey substrates and/or substrate holders (particularly substrate tables WT) therebetween. Also, one or more robot arms, conveyors, transport means or other transfer mechanisms can be provided to move a substrate W and/or substrate holder WT from the substrate handler 2 to the substrate stage 3 and/or vice-versa. For example, the substrate handler 2 and/or the substrate stage 3 may include one or more suitable substrate transporters.

In an embodiment of the invention, the substrate holder 4, WT may be movable between a position closer to the substrate handler to receive a substrate therefrom, after which the substrate holder 4, WT may be moved to a position suitable to illuminate the substrate with a projection beam. In that case, a robot or robot gripper (not shown) may be provided to transport the substrate between the substrate handler and the substrate table WT. For example, the apparatus 1 may be provided with a separate substrate handler compartment and a separate substrate stage compartment. For example, the substrate stage compartment may contain one or more exposure substrate holders 4, WT. The robot may be part of the substrate handler and/or part of the substrate stage compartment, or may be provided in a separate robot unit between a substrate handler 2 and a substrate stage 3 or substrate stage compartment.

For example, the substrate stage 3 or part of the substrate stage 3 may be movable from and to an interior 12 of the substrate handler 2. For example, the chuck 4 and/or substrate table WT may be moveable from a loading position P near a gas (e.g., air) shower 7 of the substrate handler 2 (see below) to a processing position at the substrate stage 3.

Further, the substrate handler 2 may include a thermal treatment system 19 configured to preprocess one or more substrates W. For example, the substrate handler 2 may include one or more thermal plates 19, for example a water cooled cooling plate 19, to swiftly cool one or more substrates W to a preprocessing temperature. One such cooling plate 19 has been depicted in FIG. 2. The cooling plate 19 is located away from the substrate loading position P. A mechanism to transport the substrate(s) from the cooling plate 19 to the substrate loading position P is not depicted, however, it will be clear to the skilled person how such a mechanism can be constructed. Such a transport is schematically depicted in FIG. 2 using an arrow 20.

Further, the apparatus of the embodiment of FIG. 2 is provided with a substrate temperature conditioning system, also called a substrate temperature conditioner herein, which is configured to actively condition the temperature of a substrate W before the substrate W is transferred to the substrate holder 4, WT, such that the substrate temperature substantially matches an instantaneous, real time, temperature of the substrate holder 4, WT. The substrate temperature conditioning system may also be configured to actively condition the temperature of the substrate W during transfer of the substrate W to the substrate holder 4, WT.

Such a substrate temperature conditioning system may be configured in various ways. This depends, for example, on the pressure in the substrate handler. As an example, the substrate temperature conditioning system may be provided with a first sensor 5 which is configured to measure the temperature of at least part of the substrate holder 4, WT, for example the chuck 4 and/or the substrate table WT. The first sensor 5 may include, as an example, one or more thermocouples, pyrometers, integrated temperature measurement devices, thermistors, one or more thermally sensitive materials, for example a material which contracts or expands due to temperature variations, or a combination of such or other types of thermal detectors. In an embodiment, the first sensor 5 is a temperature dependent electrical resistance sensor, which can provide a relatively precise and instantaneous temperature measurement. In an embodiment, the chuck 4 of the substrate holder 4, WT is provided with one or more first sensors 5. As an example, a plurality of first sensors 5 may be integrated within the chuck 4, for example in suitable holes or apertures manufactured in the chuck 4. By providing the chuck 4 with a plurality of first sensors 5, the average chuck temperature may be determined rather precisely. In an embodiment, the chuck 4 is manufactured such that the chuck 4 has a relatively homogeneous operating temperature. Also, when the average chuck temperature is known, through the measurement results of the first sensor 5, the average temperature of the substrate table WT can be determined, for example when the substrate table WT and chuck 4 are configured to have substantially the same average temperature or to have a certain temperature offset, and/or when the substrate table WT and chuck 4 are in close or good thermal contact. Alternatively, for example, the first sensor(s) 5 can be provided at or in the substrate table WT, for example, when the first sensor(s) 5 is integrated in the substrate table WT.

At least part of the substrate temperature conditioning system may be included in the substrate handler 2. One or more parts of the substrate temperature conditioning system may be located elsewhere in the system, for example in a suitable location in or around the substrate stage 3.

The substrate temperature conditioning system may further include one or more heating and/or cooling apparatus to heat and/or cool the substrate before the substrate is transferred to the substrate holder, and/or during such transfer. In an embodiment, the heating and/or cooling apparatus is installed near the loading position P of the substrate W, in the substrate handler 2, to thermally condition a substrate W that is located in the loading position P. Such heating and/or cooling apparatus may be constructed in various ways. As an example, the substrate temperature conditioning system may include a substrate support (not specifically shown), located in the substrate handler 2, which support can be thermally controlled to bring the temperature of a substrate W supported thereon to the desired temperature. Also, the substrate temperature conditioning system may be configured to heat and/or cool a substrate, being held in the substrate handler 2, using heat radiation, heat conductance and/or heat convection. Heat radiation and/or conduction may be useful, for example, when the pressure in the substrate handler is a relatively low pressure, or has to be kept relatively low. For example, the heating and/or cooling apparatus may include one or more heat exchangers. The heating apparatus may be, for example, an electrical heater. A cooling apparatus may include a Peltier element, a heat pipe, an apparatus which utilizes a heating/cooling fluid or liquid, or be arranged differently. The heating and/or cooling apparatus may be, for example, part of the substrate handler 2.

Cooling of a substrate may be an option, for example, during wet immersion lithography, when a liquid is located between at least part of a substrate held by the substrate support 4, WT and the projection system PS, and/or, for example, when the temperature of the substrate table WT falls during a certain period of operation of the lithographic apparatus. For example, the temperature of the substrate table WT may fall during 'dry' or non-immersion lithography, for example, when a duty cycle of the exposures of the apparatus decreases.

In an embodiment, the heating and/or cooling apparatus includes a shower 7 constructed to direct a conditioned fluid flow A towards a substrate W, when the substrate W is located in the substrate handler 2, for example when the substrate is being held on a suitable substrate support 13 of the substrate handler 2 at or near the loading position P. The substrate support 13 of the substrate handler 2 may be configured in various ways. For example, the substrate support 13 may comprise a fixed support table, a robot gripper or another suitable substrate support.

The shower 7 may be arranged in different ways. In a simple embodiment, the shower 7 is an air shower 7, arranged to direct air of a certain temperature onto the substrate W. For example, the air shower may include or be connected to an air conditioner AC which is arranged to thermally condition the air, for example to cool and/or heat the air to a desired temperature. Also, one or more fluids different than air may be used, for example, an appropriate gas (such as nitrogen) or liquid (such as water). In an embodiment, the air shower 7 is provided with one or more electric heaters 8 to heat incoming possibly relatively cool air-conditioned air to a higher temperature, so that the heated air can bring the substrate W, held in the substrate handler 2, to a higher temperature, if and as desired.

As a further example, the substrate temperature conditioning system may include a heating/cooling plate which can hold a substrate, for example, using a gas (e.g., air) bearing. Then, heat exchange between the plate and the substrate may be provided by conduction and radiation, to bring the substrate to the desired temperature. The temperature of the plate may be controlled in various ways, for example using water, heating elements and/or of Peltier elements.

The substrate temperature conditioning system may also include a second sensor 9 configured to measure the temperature of the fluid flow, flowing in and/or from the shower 7 towards the substrate W. Such a sensor can be arranged in various ways, for example as one or more thermocouples, heat sensitive materials, integrated temperature measurement devices, thermistors, or in any other way. In an embodiment, the second sensor 9 includes a temperature dependent electrical resistance.

Also, the substrate temperature conditioning system may be configured to detect or determine an average instantaneous temperature of the substrate holder 4, WT (using for example the first sensor 5), for example an instantaneous temperature of the chuck 4 and/or substrate table WT, just before and/or during transfer of a substrate W to the substrate holder. For example, the substrate temperature conditioning system may be configured to bring the temperature of the substrate W to the instantaneous temperature of the substrate holder 4, WT before, immediately before the substrate W is brought into a thermal contact with the substrate holder WT, and/or during the making of thermal contact between the substrate W and the substrate holder WT.

Also, in an embodiment, the mechanism 30 arranged or configured to transfer the substrate W and the substrate temperature conditioning system may be configured to cooperate with each other. For example, this cooperation can be to condition the temperature of the substrate prior to and/or during transfer of the substrate W to the substrate holder 4, WT, to substantially match a temperature of the substrate holder 4, WT.

In an aspect of the invention, the apparatus of FIG. 2 can be a lithographic projection apparatus, which can be arranged to project a pattern from a patterning structure onto a substrate being held by a substrate holder 4, WT. For example, the lithographic apparatus can include the discussed substrate temperature conditioning system which is configured to actively control the temperature of the substrate with respect to the temperature of the substrate holder 4, WT before the substrate is being positioned thereon, and/or during such positioning of the substrate. Additionally or alternatively, the substrate temperature conditioning system may be configured to actively control the temperature of the substrate when the substrate is being held in the substrate handler 2.

In an aspect of the invention, the substrate temperature conditioning system may be configured to control the air shower 7 such that the temperature of air flowing out of the air shower 7 substantially matches a temperature of the substrate holder 4, WT. In an embodiment, the temperature of air flowing out of the air shower 7 may be a bit higher or lower than the instantaneous temperature of the substrate support WT, so that a substrate can be brought to the substrate holder temperature relatively fast. The air temperature can be such that the air can bring the substrate to the temperature of the substrate support within a certain amount of time. For example, the apparatus may be arranged or calibrated to determine the temperature that the air should be in order to bring a substrate to a certain desired temperature in a desired amount of time. Such calibration may be obtained, for example, from trial and error and/or via standard theoretical considerations and/or calculations.

Further, the temperature conditioning system may include a controller 6 configured, for example, to measure or determine the temperature of the substrate holder 4, WT, and to compare that temperature with the temperature of a substrate W being held in the substrate handler 2. Additionally or alternatively, the controller 6 may be configured, for example, to measure or determine the temperature of the substrate holder 4, WT, and to compare that temperature with a temperature that is being applied to a substrate W being held in the substrate handler 2, for example the temperature of the air A flowing out of the air shower 7. As an example, the controller 6 may be arranged to control the heater 8 of the air shower such, that the temperature of the air flow A is raised or lowered, respectively, when it follows from the measurements (for example of the first sensor 5) that the air flow temperature is lower or higher, respectively, an instantaneous temperature of the substrate holder 4, WT. The controller 6 may include, for example, a comparator, an electronic control, a computer controller, suitable computer software and/or a different type of control. The controller 6 may be arranged to provide the above-mentioned calibration and/or to make use of such a calibration. For example, calibration data may be stored in the controller 6, or such data may be available to the controller 6 in a different way. The controller 6 may be arranged to bring a substrate W to a certain desired temperature in a desired amount of time. To this end, the controller 6 may, for example, make use of data obtained from trial and error calibration runs and/or from standard theoretical considerations and/or calculations, as will be clear to the skilled person.

Figure 3:
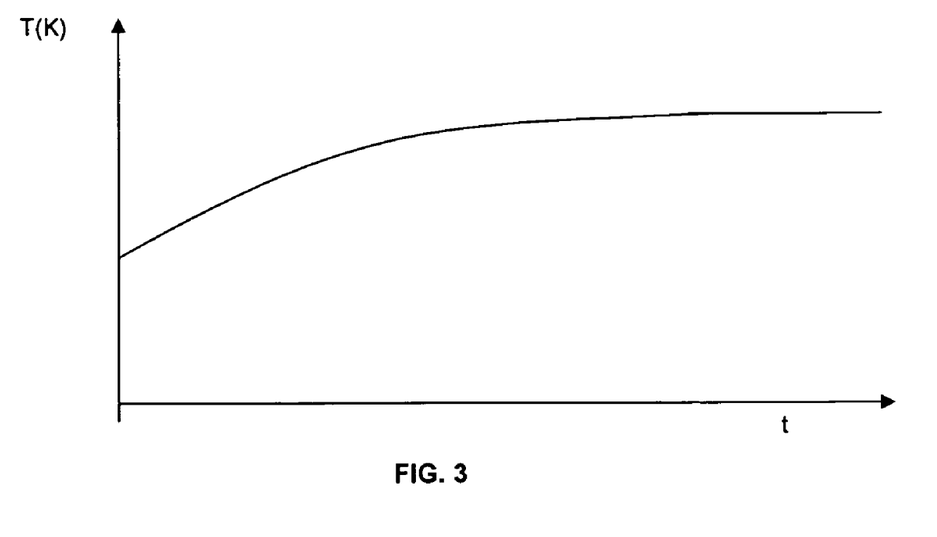
FIG. 3 depicts a graph showing a possible temperature rise of an average substrate table temperature versus time.

During use of the embodiment of FIG. 2, the apparatus may perform a device manufacturing method, comprising transferring a pattern from a patterning structure onto a substrate W, the substrate being held by the substrate holder 4, WT. For example, a pattern may be projected from a patterning structure onto a substrate being held by a substrate holder, wherein the temperature of the substrate is actively controlled to the temperature of the substrate support structure, for example, before the substrate is positioned onto the substrate holder, and/or during such positioning. Depending on the manufacturing method, for example, the average temperature of the substrate holder 4, WT may rise during a certain period of time, as has been shown schematically in FIG. 3. This time period may include, for example, a plurality of exposure sequences in which a plurality of substrates are being subsequently illuminated by the apparatus. Such a time period can depend, for example, on the throughput of the apparatus, since a higher throughput could lead to more heat development and a faster rise of the average temperature T of the substrate holder 4, WT.

The temperature of the substrate W may be actively conditioned, such that the substrate temperature substantially matches an instantaneous temperature of the substrate holder 4, WT during or just before the substrate touches the substrate holder 4, WT. In this way, for example, the temperature of the substrate W may be manipulated inside the substrate handler 2 to match the temperature of, for example, the chuck 4 and/or the substrate table WT, before the substrate is loaded to the substrate stage. This may be simply realized, for example, via the controller 6, by measuring the temperature of the chuck 4 and/or substrate table WT using the respective sensor(s) 5, and by controlling or changing the temperature of the air flowing from the air shower 7 onto the substrate W utilizing the heater 8. For example, an electric current provided to an heating element of an electric heater 8 may be actively controlled based on a measured temperature of the chuck 4 and/or substrate table WT, and, for example, also based on one or more temperature measurements of the temperature of air A flowing from the air shower. Optionally, a calibration may be provided to tune the temperature of the air leaving the air shower 7 such that the substrate W may obtain substantially the same temperature as the instantaneous measured temperature of the substrate holder 4, WT. Alternatively or additionally, one or more detectors (not shown) may be used which directly or indirectly measure the temperature of the substrate W, wherein the result of that measurement can be used by the controller 6 to match the substrate temperature to the temperature of the substrate holder 4, WT.

In an embodiment, the temperature of the substrate holder 4, WT may be measured using the first sensor 5, wherein the result of the measurement may be used to condition the temperature of the substrate prior to and/or during transfer of the substrate to the substrate holder 4, WT.

During use, the substrate may be heated or cooled to a temperature of the substrate holder 4, WT (for example an average instantaneous temperature thereof) prior to and/or during transfer of the substrate to the substrate holder. As an example, the substrate W may be stored at least temporarily in the substrate handler 2 before the substrate W is transferred to the substrate holder WT, wherein the thermal conditioning of the substrate is carried out in or by the substrate handler 2. As follows from the above, in an embodiment, a flow of conditioned fluid may simply be directed towards the substrate W before the substrate is transferred to the substrate holder 4, WT and/or during such transfer, to bring the temperature of the substrate substantially to an instantaneous temperature of the substrate holder. In that case, the temperature of the fluid flow may be measured and compared to the measured temperature of the substrate holder 4, WT, wherein the temperature of the fluid flow is raised or lowered, respectively, when it follows from the measurements that the fluid flow temperature is lower or higher, respectively, than the substrate support temperature. After the temperature of the substrate W has been substantially matched to the temperature of the substrate holder 4, WT, the substrate W may be brought in thermal contact with the substrate holder 4, WT, wherein for example substrate distortion and/or overlay errors may be prevented or diminished.

In an embodiment, at least the instantaneous temperature of the substrate holder 4, WT may be detected or determined during use, just before the substrate W is transferred to the substrate holder, for example just before the substrate W is brought in direct thermal contact with the substrate holder. Also, in that case, the temperature of the substrate may be brought to the instantaneous temperature of the substrate holder before the substrate is transferred to the substrate holder, and/or during such transfer.

In an embodiment, feed forward principles may applied to the substrate temperature conditioning system. This may be achieved, for example, using parameters to determine the temperature of the substrate holder indirectly, such as actuator currents of one or more nearby actuators, projection beam radiation intensity or other suitable parameters. Using feed forward and one or more such parameters, the temperature of the substrate holder can be estimated. Then, the substrate temperature conditioning system may condition the temperature of the substrate, to substantially match the estimated temperature of the substrate holder. For example, to this end, the substrate temperature conditioning system may be arranged to estimate and/or calculate a substrate holder temperature.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning structure defines the pattern created on a substrate. The topography of the patterning structure may be pressed into a layer of resist supplied to the substrate whereupon the resist is cured by applying electromagnetic radiation, heat, pressure or a combination thereof. The patterning structure is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus arranged to transfer a pattern from a patterning structure onto a substrate, comprising:
   a substrate holder configured to hold a substrate; and
   a substrate handler constructed to store the substrate before the substrate is transferred to the substrate holder, the substrate handler comprising a substrate temperature conditioner configured to condition a temperature of the substrate prior to, during, or both, a transfer of the substrate to the substrate holder to substantially match a temperature of the substrate holder, wherein at least part of the substrate holder is configured to be movable toward and from the substrate handler to transfer the substrate.

2. The apparatus according to claim 1, further comprising a temperature sensor configured to measure the temperature of the substrate holder.

3. The apparatus according to claim 1, wherein the substrate temperature conditioner comprises a heating apparatus, a cooling apparatus, or both, configured to respectively, heat, cool, or both, the substrate.

4. The apparatus according to claim 3, wherein the heating apparatus, cooling apparatus, or both, comprises one or more members selected from the group of a heating and/or cooling plate, an air bearing, a Peltier element, and an electrical heater.

5. The apparatus according to claim 3, wherein the heating apparatus, cooling apparatus, or both, comprises a shower constructed to direct a conditioned fluid flow towards the substrate.

6. The apparatus according to claim 5, comprising a further sensor configured to measure the temperature of the conditioned fluid flow.

7. The apparatus according to claim 5, wherein the conditioned fluid flow is conditioned air.

8. The apparatus according to claim 1, wherein the substrate temperature conditioner is configured to detect, determine, or both, an instantaneous temperature of the substrate holder just before the substrate is transferred to the substrate holder, and the substrate temperature conditioner is configured to bring the temperature of the substrate to the instantaneous temperature of the substrate holder.

9. The apparatus according to claim 1, comprising a mechanism configured to transfer one or more substrates from the substrate handler to the substrate holder.

10. The apparatus according to claim 9, wherein the mechanism and the substrate temperature conditioner are configured to cooperate with each other, to condition the temperature of the substrate prior to, during, or both, the transfer of the substrate to the substrate holder to substantially match a temperature of the substrate holder.

11. The apparatus according to claim 1, wherein the substrate temperature conditioner is configured to estimate, calculate, or both, the temperature of the substrate holder.

12. A lithographic apparatus arranged to transfer a pattern from a patterning structure onto a substrate, the apparatus comprising:

a substrate holder configured to hold a substrate; and
a substrate handler constructed to store the substrate before the substrate is transferred to the substrate holder, the substrate handler comprising a temperature control system configured to actively control the temperature of the substrate, based on a temperature of the substrate holder, prior to, during, or both, a positioning of the substrate onto the substrate holder,
wherein at least part of the substrate holder is configured to be movable toward and from the substrate handler to transfer the substrate.

13. The apparatus according to claim 12, wherein the temperature control system is configured to actively control the temperature of the substrate when the substrate is being held in the substrate handler.

14. The apparatus according to claim 13, wherein the substrate handler comprises an air shower which is part of the temperature control system.

15. The apparatus according to claim 14, wherein the temperature control system is configured to control the air shower such that the temperature of air flowing out of the air shower substantially matches the temperature of the substrate holder, or such that the air flowing out of the air shower can bring the substrate to the temperature of the substrate holder within a certain amount of time.

16. The apparatus according to claim 14, wherein the apparatus is configured to determine the temperature that the air should be in order to bring a substrate to a certain desired temperature in a desired amount of time.

17. A device manufacturing method, comprising conditioning a temperature of a substrate prior to, during, or both, a transfer of the substrate to a substrate holder, using a substrate temperature conditioner of a substrate handler, to substantially match a temperature of the substrate holder and transferring a pattern from a patterning structure onto the substrate after the substrate has been transferred to the substrate holder, wherein at least part of the substrate holder is movable between a position closer to the substrate handler to receive a substrate therefrom, and a position suitable to illuminate the substrate with a projection beam.

18. The method according to claim 17, further comprising measuring the temperature of the substrate holder, wherein the result of the measurement is used in conditioning the temperature of the substrate to match the temperature of the substrate holder.

19. The method according to claim 17, comprising heating or cooling the substrate to the temperature of the substrate holder.

20. The method according to claim 17, further comprising storing the substrate at least temporarily in a substrate handler before the substrate is transferred to the substrate holder and wherein the conditioning of the substrate is carried out in or by the substrate handler.

21. The method according to claim 17, comprising directing a flow of conditioned fluid towards the substrate to bring the temperature of the substrate substantially to an instantaneous temperature of the substrate holder.

22. The method according to claim 21, comprising determining and comparing a temperature of the fluid flow to a measured temperature of the substrate holder and raising or lowering the temperature of the fluid flow when the fluid flow temperature is lower or higher, respectively, than the measured temperature.

23. The method according to claim 21, wherein the fluid flow is a gas flow.

24. The method according to claim 21, wherein a heater is used to raise the temperature of the fluid flow, if desired.

25. The method according to claim 17, comprising detecting or determining an instantaneous temperature of the substrate holder just before the substrate is transferred to the substrate holder and bringing the temperature of the substrate substantially to the instantaneous temperature of the substrate holder.

26. The method according to claim 17, comprising estimating, calculating, or both, the temperature of the substrate holder and conditioning the temperature of the substrate using the result of the estimation, calculation, or both.

27. A lithographic method, comprising actively controlling a temperature of a substrate, using a substrate temperature conditioner of a substrate handler, substantially to the temperature of a substrate holder, prior to, during, or both, a transfer of the substrate to the substrate holder and transferring a pattern from a patterning structure onto the substrate after the substrate has been transferred to the substrate holder, wherein at least part of the substrate holder is movable between a position closer to the substrate handler to receive a substrate therefrom, and a position suitable to illuminate the substrate with a projection beam.

28. The method according to claim 27, comprising actively controlling the temperature of the substrate when the substrate is held in a substrate handler.

29. The method according to claim 28, further comprising transferring a substrate into the substrate handler and, after the transfer, actively controlling the temperature of the substrate to substantially match an instantaneous temperature of the substrate holder.

30. The method according to claim 27, comprising actively controlling the temperature of the substrate using an air shower.

31. The method according to claim 30, comprising controlling the air shower such that a temperature of air flowing out of the air shower substantially matches a temperature of the substrate holder, or such that air flowing out of the air shower can bring the substrate to the temperature of the substrate holder within a certain amount of time.

32. A method for handling substrates, comprising determining an instantaneous average temperature of a substrate holder and conditioning a substrate to substantially the determined instantaneous average temperature of the substrate holder, wherein at least part of the substrate holder is movable between a position closer to a substrate handler to receive a substrate therefrom, and a position suitable to illuminate the substrate with a projection beam.

33. The method according to claim 32, further comprising storing the substrate at least temporarily in the substrate handler before the substrate is transferred to the substrate holder, and wherein the conditioning of the substrate is carried out in or by the substrate handler.

34. The method according to claim 32, further comprising directing a flow of conditioned fluid towards the substrate to bring the temperature of the substrate substantially to an instantaneous temperature of the substrate holder.

35. The method according to claim 32, further comprising actively controlling the temperature of the substrate using an air shower, and controlling the air shower such that a temperature of air flowing out of the air shower substantially matches a temperature of the substrate holder, or such that air flowing out of the air shower can bring the substrate to the temperature of the substrate holder within a certain amount of time.

* * * * *